United States Patent
Saluel et al.

(10) Patent No.: US 7,189,496 B2
(45) Date of Patent: Mar. 13, 2007

(54) METHOD FOR THE MANUFACTURE OF AN ACTIVE MATRIX, CORRESPONDING ELECTRO-OPTICAL DISPLAY DEVICES AND MASK

(75) Inventors: Didier Saluel, St Sauveur (FR); Jean-Charles Terrien, La Buisse (FR); Hugues Lebrun, Coublevie (FR)

(73) Assignee: Thales, Paris (FR)

( * ) Notice: Subject to any disclaimer, the term of this patent is extended or adjusted under 35 U.S.C. 154(b) by 279 days.

(21) Appl. No.: 10/634,792

(22) Filed: Aug. 6, 2003

(65) Prior Publication Data

US 2005/0074708 A1 Apr. 7, 2005

(30) Foreign Application Priority Data

Aug. 6, 2002 (FR) ................... 02 09998

(51) Int. Cl.
*G03F 7/22* (2006.01)
(52) U.S. Cl. .................. 430/319; 430/321; 430/394
(58) Field of Classification Search ............... None
See application file for complete search history.

(56) References Cited

U.S. PATENT DOCUMENTS

| 5,656,526 A | * | 8/1997 | Inada et al. | .................. 430/314 |
| 5,667,923 A | | 9/1997 | Kanata | |
| 5,700,604 A | | 12/1997 | Okino | |
| 5,795,686 A | * | 8/1998 | Takizawa et al. | ............... 430/5 |
| 5,888,682 A | | 3/1999 | Nakasuji | |
| 6,503,671 B1 | | 1/2003 | Nakajima | |
| 6,504,581 B1 | * | 1/2003 | Hirosue et al. | ................. 349/4 |

FOREIGN PATENT DOCUMENTS

| JP | 2000-100692 | 4/2000 |
| JP | 2001-110700 | 4/2001 |

\* cited by examiner

*Primary Examiner*—John A. McPherson
(74) *Attorney, Agent, or Firm*—Oblon, Spivak, McClelland, Maier & Neustadt, P.C.

(57) ABSTRACT

In a method for the manufacture of an active matrix for an electro-optical display device, the active zone exposure fields CH1, CH2 are obtained by the transfer of an active zone mask in such a way that there is a non-null overlap zone zl, zr, zt, zb between two successive exposure fields. The active zone mask is exposed a first time. This mask is positioned for the next exposure so as to overlap the first exposed field on a certain width $F_1$, $F_2$. In the overlap zones, an exposure of the mask provides only a part of the patterns.

16 Claims, 12 Drawing Sheets

SECTION A1-A2

SECTION A2-A3

SECTION A3-A4

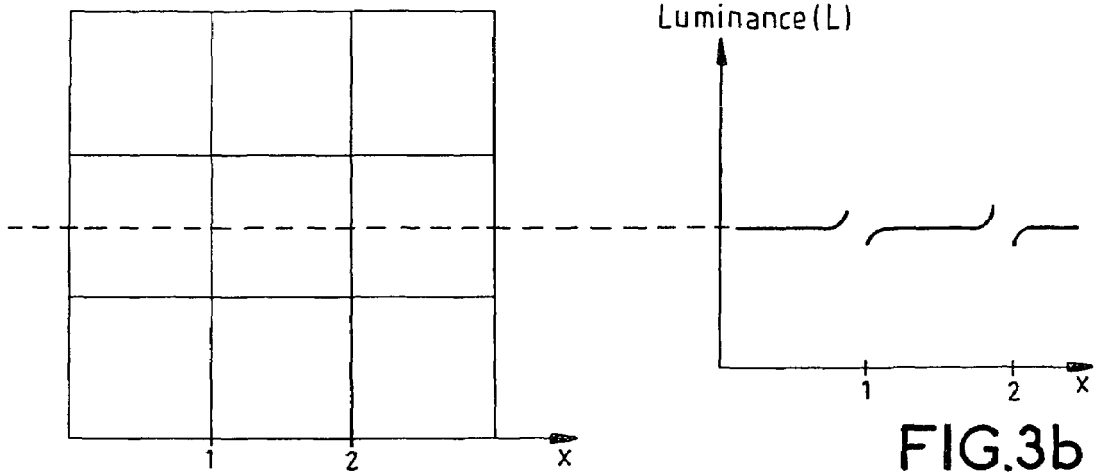
FIG.3a
FIG.3b
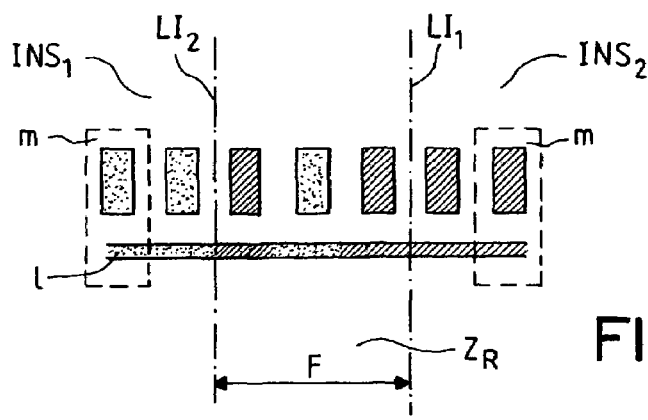
FIG.4
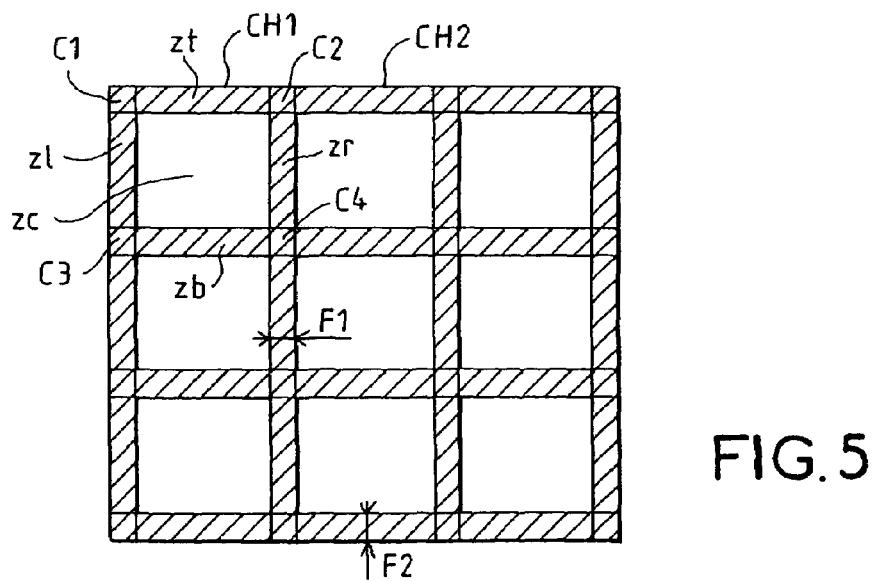
FIG.5

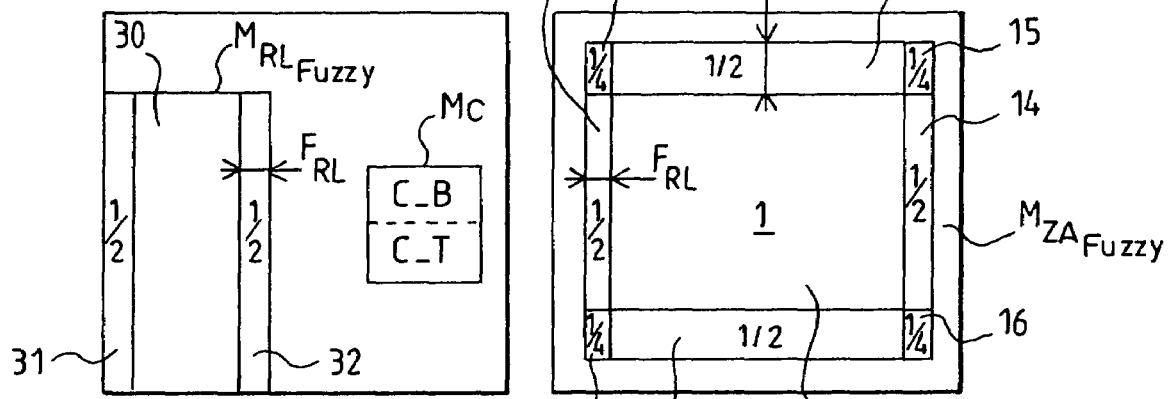
FIG.10a
FIG.10b
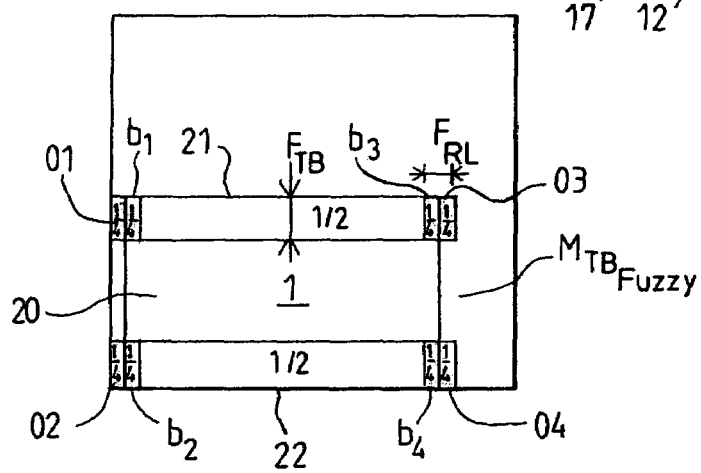
FIG.10 c
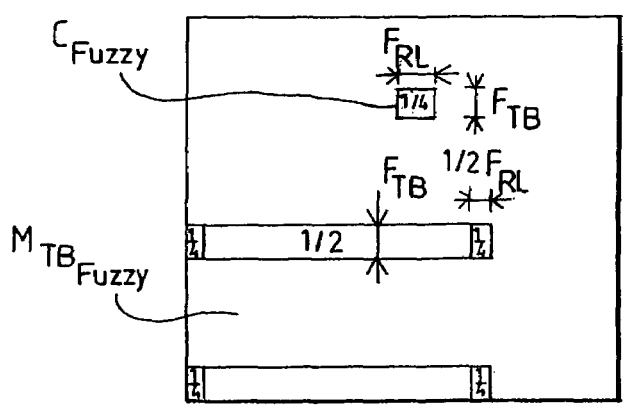
FIG.10d

Periodicity constraint

METHOD FOR THE MANUFACTURE OF AN ACTIVE MATRIX, CORRESPONDING ELECTRO-OPTICAL DISPLAY DEVICES AND MASK

BACKGROUND OF THE INVENTION

1. Field of the Invention

The present invention relates to a method for the manufacture of active matrices for electro-optical display devices. It can be applied especially to the manufacture of high-density flat screens. It can be applied more generally to matrix display devices used in direct viewing or in projection.

To put it in simple terms, an active matrix display device comprises cells arranged in a crossed array of rows and columns, each cell comprising a pixel associated with an electronic switch. This switch is formed by an active element, which may be a transistor or a diode, that is electrically connected to a column of the array and connects the pixel to a row of the array. These cells are all identical. They are obtained from the same pattern at each level of manufacture. These cells form the active zone of the matrix circuit. Control and addressing circuits for the rows and columns of the matrix are positioned at the periphery. These circuits form the peripheral zone of the matrix.

Since the active zone of the active matrices for high-density screens has a large surface area, far greater than the size of the exposure fields, their manufacture requires the use of a stepper for the transfer and exposure, several times, of the same mask or reticle through which the patterns of the cells are formed. In a typical example, to make a display screen sized 600 by 600, the same mask is transferred nine times to cover the entire surface of the active zone.

2. Description of the Prior Art

FIG. 1a shows a glass plate 1 on which four display screens E1 to E4 are made. The active zone mask is transferred nine times for each screen, corresponding on the plate to the insulated fields marked ZA. In this example, the peripheral zone is obtained by means of four peripheral masks: the corresponding exposed fields are marked T-B for "Top-Bottom", corresponding to the peripheral column control part; RL for "Right-Left", corresponding to the peripheral row control part of the matrix and C-T (pour Corner-Top) and C-B (for Corner-Bottom) corresponding respectively to the upper and lower corners in the peripheral zone of the screens. The screens are then separated.

In practice, there is a stack of conductive layers and insulating layers to form an active matrix cell. For each of the levels of manufacture, there is a set of masks with designs corresponding to the level concerned. If we take the example of a thin-film transistor or TFT active matrix cell, shown in a top view in FIG. 1b and in longitudinal section views along A1–A2, A2–A3 and A3–A4 in FIGS. 1c to 1e, the conductive layers have different metal layers, for example a titanium-molybdenum (TiMo) layer for the selection rows and the gates of the transistors, a molybdenum (Moly) layer b for the sources and drains of the transistors and the columns of the matrix, a transparent layer c made of indium-tin oxide (ITO) for the pixel electrodes and a thin layer d made of semiconductor material (intrinsic amorphous silicon, n+ doped material, etc.) for the channel of the transistors. There are also different layers of insulating material f, g (nitride, etc) on which, in particular, peripheral contacts are etched. For each of these layers, there is a deposit of the layer of material, followed by a layer of photosensitive resin, then photo-exposure through a mask or reticle, development and etching. Each of these layers therefore has a corresponding masking level, with a corresponding set of masks. In the example shown in FIG. 1b, we thus have six masking levels, to which a seventh level is generally added. This seventh level corresponds to an (organic) insulating opaque level that is etched above the insulating layer g, to serve as an "LBL" (Light Blocking Layer) optical mask above each transistor (FIG. 1b). These masks are formed on one or more reticles, according to the place available on these reticles and the applicable design and layout rules. For the manufacturing level shown in FIG. 1a, the masks used are for example the set of masks [M-ZA, M-TB, M-RL, M-C] shown in FIG. 1f, and formed on three reticles, r1, r2 and r3. The corner mask M-C comprises the designs for the upper corner and lower corner corresponding to the exposed fields C-T and C-B in FIG. 1a. A particular feature of the mask of the active zone is that it is formed by a design of identical patterns, distributed in a crossed array of rows and columns, each pattern corresponding to a cell of the matrix.

In a step for the exposure of the designs or patterns of the active zone, the same mask M-ZA is thus transferred successively several times, nine times in the example shown, so as to cover the entire surface of the active zone. This transfer is made edge to edge, along the rows and the columns. It is done with a certain degree of imprecision corresponding to the tolerance of positioning of the stepper used and to the defects related to photo-exposure. These defects are especially edge effects, magnification, optical aberration, rotation and x-axis or y-axis misalignment of the mask. These defects are variable form one exposure field to another. They cause imprecision in the reproduction of the image or design at the boundary or junction between two successive exposure fields. This is the defect known as the "stepper pattern" defect which acts on the electro-optical qualities of the display device. This defect corresponds to the visual impact of a variation of the stray capacitive couplings of the cells of the matrix located at the boundary between two successive exposure fields. For example, in the case of a thin-field transistor (TFT) active matrix, there are unwanted couplings between the gate (row), the source (column) and the pixel electrode or the drain. These couplings are sensitive to the defects of the designs of the gates, the semiconductor layers, columns and drains of the TFTs and pixel electrodes. Along the boundary between two exposure fields, these couplings may have values that diverge from the mean value of the couplings in the very interior of the exposure fields.

In a screen without any "stepper pattern" flaw, the value of the couplings is uniform throughout the surface of the screen. The variation in the values of the couplings between two exposure zones due to the misalignment of the exposed designs on the matrix acts on the luminance of the concerned pixels along the boundaries between the different exposure zones. The real voltage applied to the terminals of the corresponding pixels will therefore be different along these boundaries, and this is something that will be seen visually: this is the stepper pattern.

If a voltage V is applied to the terminals E and CE of a pixel as shown schematically in FIG. 2b, in the case of a TN (twisted nematic) liquid crystal, the luminance is highly sensitive to the amplitude of this voltage. As shown in FIG. 2a which shows a luminance curve as a function of the amplitude of the voltage, L=f(V), it is in the zone of the gray levels that the variation is very great. Thus, with fields insulated according to the prior art, a luminance curve that is discontinuous is obtained on the active zone: the curve is not joined at the passage between the exposure boundaries.

In practice, this break implies difficulty in accurately restoring the gray levels. On a display screen, the junctions between the different exposure fields of the active zone can be seen visually, as illustrated in FIG. 3a. This is because of the breaks in the luminance curve, for example of the type shown in FIG. 3b, along the x-axis. There is therefore a deterioration in visual quality.

There is a known method according to which, to reduce the effects of the mask-positioning errors, the boundaries between the exposure fields are shifted from one exposure level to another. In other words, the boundaries are not reproduced at the same positions from one level to the other. When this is done, the electro-optical effects due to the positioning errors are distributed by sliding the exposure boundaries on the surface of the matrix instead of putting them always the same place.

In the invention, another solution is sought to efficiently reduce the harmful effects due to the successive transfers of the active zone mask.

In the invention, a method is sought for the manufacture of an active matrix enabling a significant improvement in the visual quality of the display screens.

The idea on which the invention is based lies in transferring the active zone mask so that there is a non-zero overlap zone between two successive exposure fields. If a part of the active zone of the matrix is exposed a first time, the mask is positioned for the next exposure so as to overlap the first exposed field on a certain width, corresponding to the width of a peripheral zone defined on the mask. In this peripheral zone of the mask, the design to be made is incomplete or fuzzy.

A mask (or reticle) of an active matrix can be described as a a square-ruled layout or grid, in which each intersection of a row and the column is a dot that corresponds to an active matrix cell. This dot is actually an elementary pattern of the design (positive or negative) to be made on a cell for a level of etching considered. Thus, there is a design of identical patterns arranged in a crossed array of rows and columns corresponding to the crossed array of rows and columns of the matrix.

According to the invention, a central zone and a peripheral zone are defined on this mask. The elementary pattern is designed at each of the dots of the central zone of the mask. In the peripheral zone, this pattern is not drawn at certain dots. These dots are distributed randomly or pseudo-randomly.

The mask thus defined is transferred by causing the peripheral zone between two successive exposure fields to be overlapped. Each exposure thus provides a part of the patterns in the overlapped zones on the matrix. Preferably, each exposure provides the same density of patterns. Finally, the designs of the patterns in the overlap zones complete each other. In the overlap zones on the active matrix, there is a random spatial distribution of the patterns provided by the different exposures corresponding to the random distribution of the pattern-free dots between the different parts of the peripheral zone of the mask.

With this method of exposure, there is no longer any sharp boundary between two exposure fields, corresponding to an edge-to-edge transfer as in the prior art. On the contrary, there is a fuzzy boundary due to the width of the overlap zone, and the random or pseudo-random character of the spatial distribution of the patterns in this zone.

The method of overlapping according to the invention can be applied especially to the layers that play a direct role in the above-mentioned problems. In one example of a TFT active matrix, as illustrated in FIG. 1b, the method can be applied especially to the three masking levels of the layers b, d and c respectively corresponding to the columns, the channels of the thin-film transistors (TFTs) and the ITO pixel electrodes. More generally, this method can be applied to each of the masking levels of the active matrix, for example the seven levels described in detail with reference to FIG. 1b.

SUMMARY OF THE INVENTION

The invention therefore relates to a method for the manufacture of an active matrix comprising an active zone comprising a set of cells arranged in an array of rows and columns. The method comprises at least one step for depositing a layer of a material and making a pattern on this layer by means of a mask transferred several times to the active zone, so as to make successive exposure fields covering the totality of this zone. There is a non-null overlap zone between two successive exposure fields, each exposure providing a part of the patterns to this zone.

According to one aspect of the invention, in a field overlap zone, the patterns to be made are provided by at least two exposures of the active zone mask, the patterns of the overlap zone being distributed between the different exposures randomly or pseudo-randomly.

Preferably, each of the steps of exposure of the active zone mask in the overlap zone provides substantially the same density of patterns, according to a complementary distribution of the patterns.

The invention also relates to an active matrix electro-optical display or detection device obtained according to such a method.

The invention also relates to a mask used to take an exposure of a design formed by identical patterns positioned in a crossed array of rows and columns, each pattern being drawn at the point of intersection of a row and a column. The mask comprises a peripheral part around the central zone and the design is incomplete in the peripheral zone, certain of the patterns being not made at certain dots of this zone.

According to one aspect of the invention, the peripheral zone comprises a left lateral part, a right lateral part, an upper part and a lower part, said parts having in common, in sets of two, one corner among the four corners of the mask, the distribution of the pattern-free dots in the peripheral zone is such that the left lateral and right lateral parts, respectively the upper and lower parts, are complementary, the design of the one being the negative of the other outside these corners, and the four corners are complementary.

According to another aspect of the invention, the distribution of the pattern-free dots between the mutually complementary parts, is random or pseudo-random.

Preferably, the distribution of the pattern-free dots in this peripheral zone of the mask is done as a function of the mode of addressing the rows and/or columns of the display device.

According to another aspect of the invention, for color display devices, the distribution of the pattern-free dots in this peripheral zone of the mask is done as a function of the structure of the colored filters on the active matrix.

BRIEF DESCRIPTION OF THE DRAWINGS

Other advantages and features of the invention shall appear more clearly from the following description, given by way of an indication that in no way restricts the scope of the invention and with reference to the appended drawings, of which:

FIG. 4 is a drawing showing the principle of a method of exposure by overlapping of fields according to the invention, FIG. 5 is a schematic illustration of the exposure fields made according to the invention at a given level of an active matrix.

MORE DETAILED DESCRIPTION

Figure 1A:
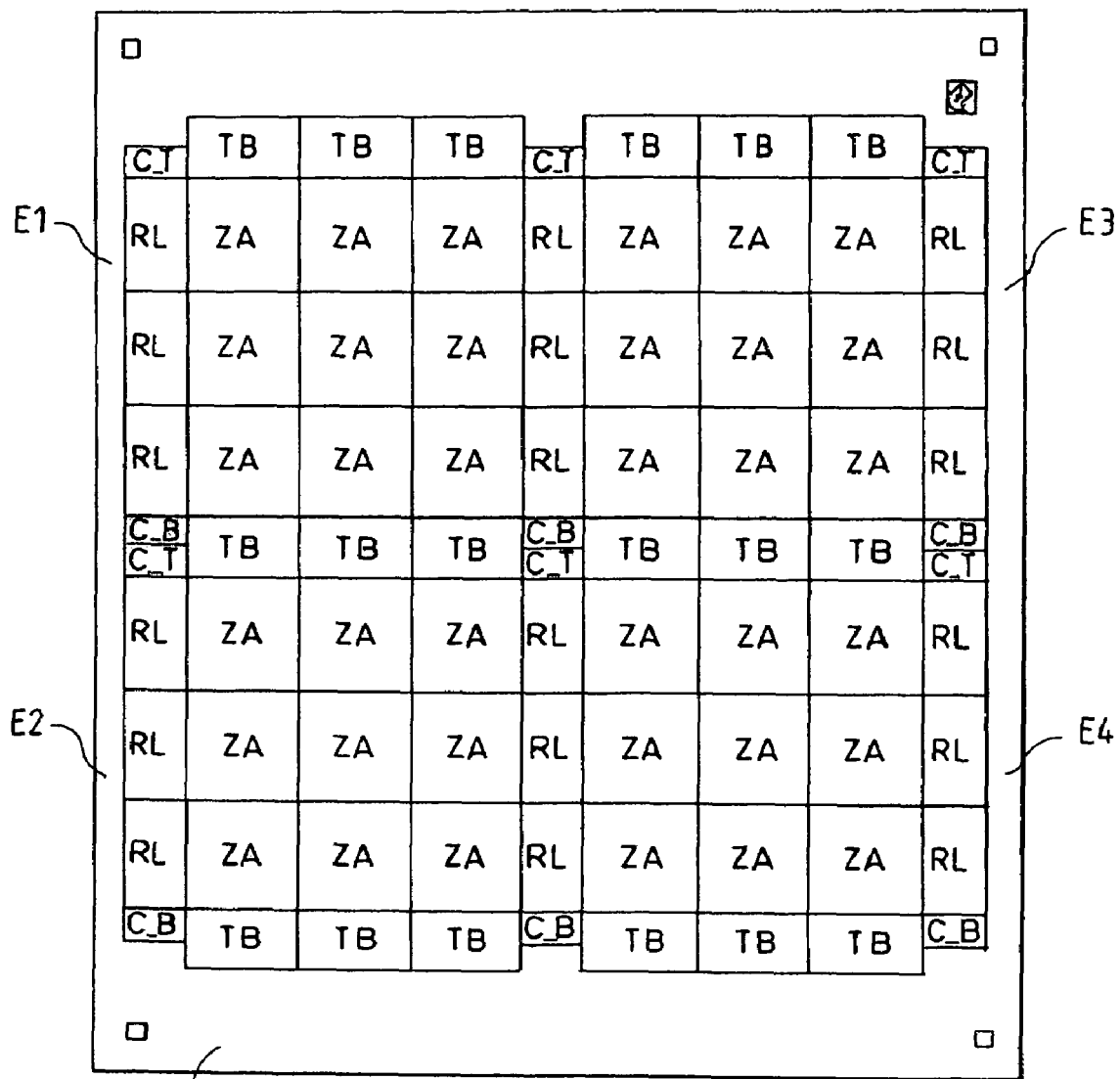
FIGS. 1a to 1f already described represent exposed fields in active and peripheral zones of active matrix screens, top and longitudinal sectional views of a thin-film transistor (TFT) active matrix cell and masks used according to prior art manufacturing methods.
Figure 1F:
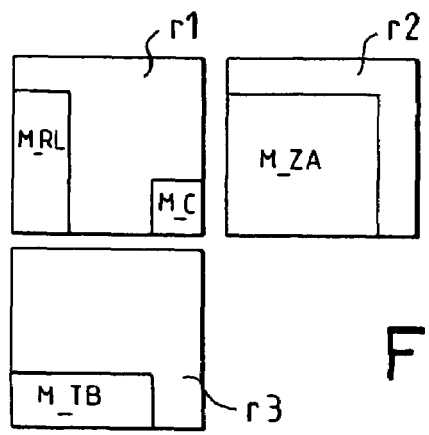
Figure 1B:
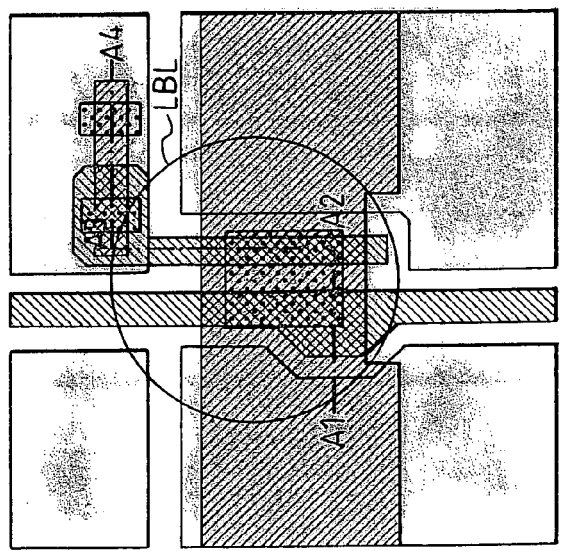
Figure 1C:
Figure 1D:
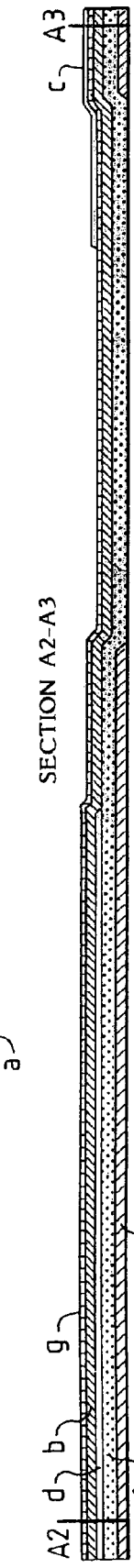
Figure 1E:
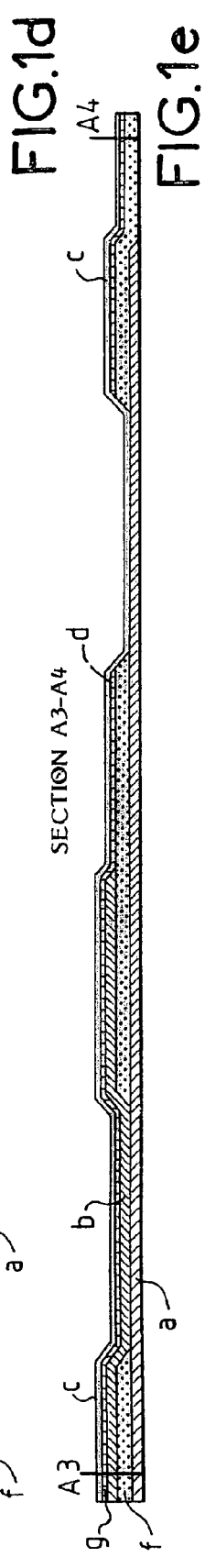
Figure 2A:
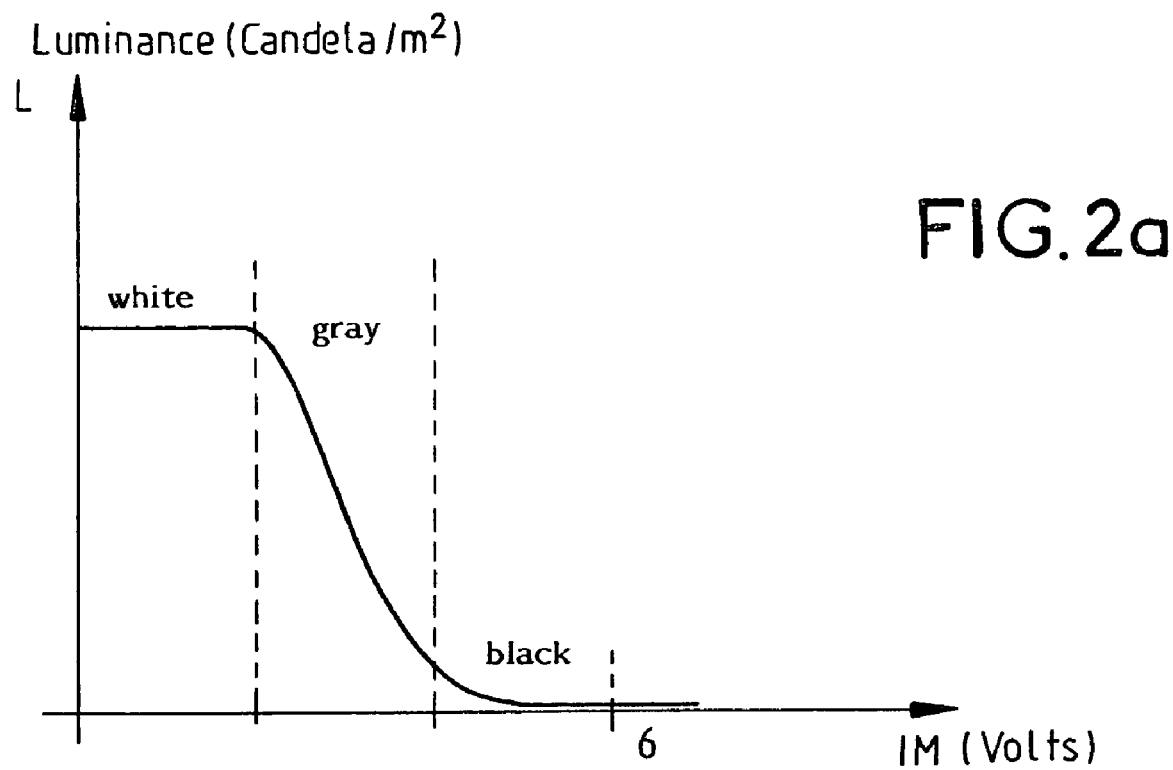
FIGS. 2a and 2b already described respectively represent a drawing of a pixel and a luminance curve of this pixel as a function of the amplitude of the real voltage V applied to the terminals of the pixel, FIGS. 3a and 3b, already described, represent the defect known as the stepper-pattern defect such as can be seen (FIG. 3a) on a display device obtained according to a prior art method due to discontinuities in the luminance curve at the boundaries (FIG. 3b)
Figure 2B:
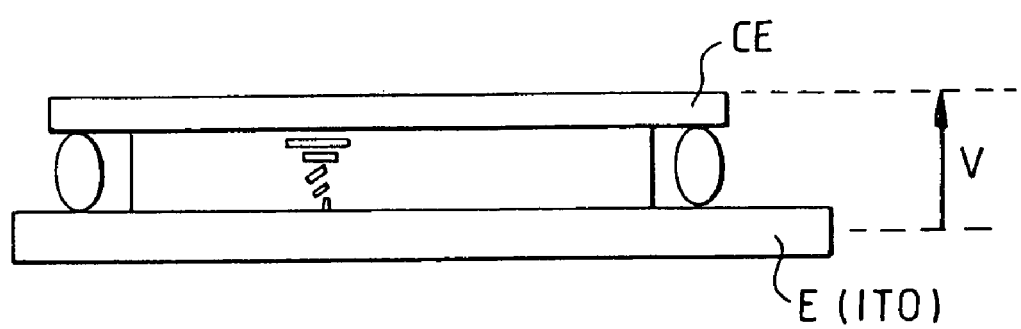

The principle of exposure according to the invention is illustrated in FIG. 4, which shows an overlap zone $Z_R$ with a width F overlapping two exposure fields $I_{NS_1}$ and $I_{NS_2}$. These insulation fields have been obtained from a mask, to reproduce an identical pattern m at each dot of the active matrix.

Each exposure field has a zone in which all the patterns m are made and a peripheral zone in which only certain patterns are made. A first exposure of the mask is made, giving a first exposure field $I_{NS_1}$. A second exposure of the same mask is made, in placing the mask in such a way that the peripheral zone of the mask gets superimposed on the peripheral zone of the previously exposed field. The figure shows the right-hand lateral boundary $LI_1$ of the exposure. The left-hand lateral peripheral part of the mask is superimposed on the right-hand lateral peripheral part of the first field $I_{NS_1}$ to make the second exposure field $I_{NS_2}$. The overlap zone $Z_R$ on the active matrix is thus delimited to the right by the exposure boundary $LI_1$ of the first field and, to the left, by the exposure boundary $LI_2$ of the second field $I_{NS_2}$. This overlap zone has patterns m given by the first exposure, speckled in the figure and patterns m given by the second exposure, hatched in the figure. This overlap zone has a width F. In a practical example, for a 600 by 600 active matrix, the width of the overlap zone may correspond to about twenty rows (upper and lower peripheral parts) or columns (lateral peripheral parts).

Preferably, to favor the continuity of the patterns in the overlap zone, for example to provide for the continuity of the rows I in FIG. 4, the invention uses a joining technique known as "stitching" commonly used on the edges of the masks. This technique consists in going slightly beyond certain of the real dimensions of certain patterns in the drawing of the mask, to compensate for repositioning errors in the overlap zone. Since the mask is exposed twice in this overlap zone, after development on the active matrix plate, the same dimensions are obtained throughout.

FIG. 5 gives a schematic view of the exposure fields CH1, CH2 obtained on an active matrix masking level according to the invention. The overlap zones are indicated in hatched portions in the figure. For a given exposure field, CH1 for example, the overlap zone comprises the peripheral parts, around the central zone zc, namely the left lateral part zl and right lateral part zr, and the upper part zt and lower part zb. When these parts are taken in sets of two, each set has one of the four corners $c_1$, $c_2$, $c_3$, $c_4$ of the field in common. In the central zone, the density of the patterns provided by an exposure is 1, while in the overlap zone is it is smaller. The active zone mask has been transferred nine times in this example, and each time it has overlapped a zone of the previous exposure field. On the edges of the active matrix, different overlap techniques may be used to give the missing pattern. It is possible, for example, to provide for additional masks for the edges, or to use at least some of the masks of the peripheral circuits as shall be described in detail further below.

Figure 6:
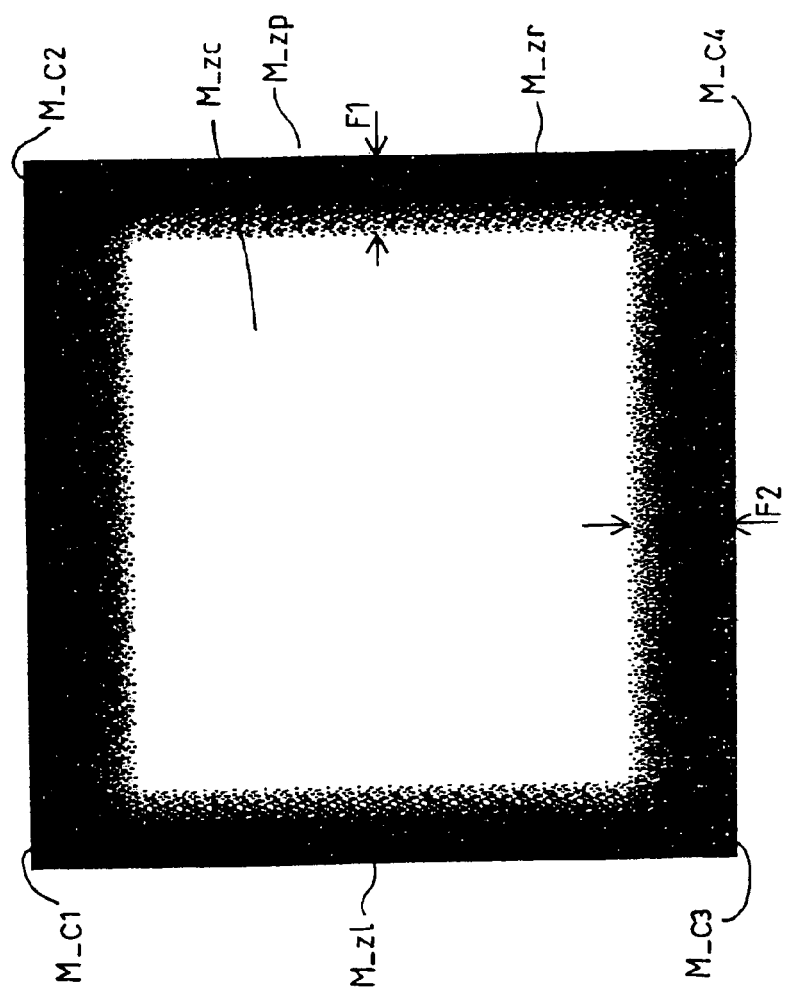
FIG. 6 is an image of an active zone mask according to the invention.

FIG. 6 shows the image of an exposure mask according to the invention. This is usually a glass plate, on which chrome has been deposited and then etched. In the example, the zones or black dots from which the chrome has not been removed, are pattern-free zones or dots. The central zone M-zc is thus seen as being entirely blank. In the peripheral zone M-zp, all around the central zone, patterns are missing. This peripheral zone M-zp comprises left lateral parts M-zl and right lateral parts M-zr and upper M-zt and lower (M-zb) parts. When these parts are considered in sets of two, each set has, in common, one of the four corners of the mask M-$c_1$, M-$c_2$, M-$c_3$, M-$c_4$.

In this peripheral zone, the pattern-free black dots are distributed randomly or pseudo-randomly among the different parts of the peripheral zone.

Figure 7:
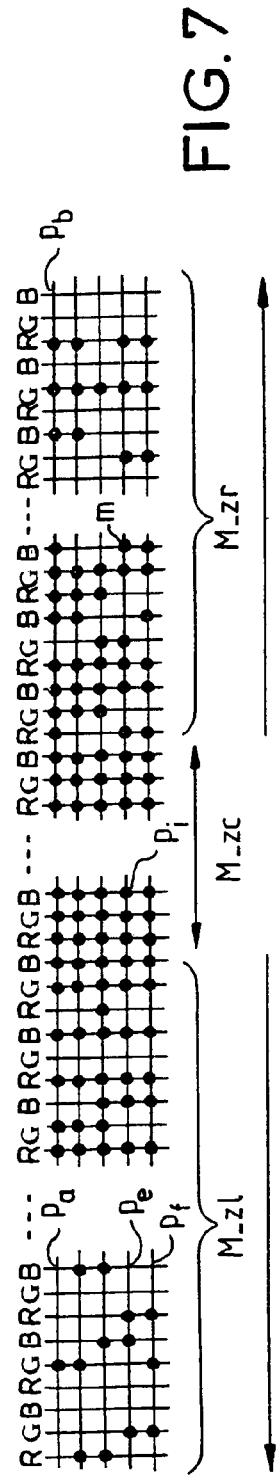
FIG. 7 illustrates the principle of the making of exposure masks according to the invention.

FIG. 7 gives a detailed view of a sample design of the mask that corresponds to a longitudinal central band of this mask. The crossed array of rows and columns corresponds to the array of the active matrix. It constitutes the design frame of the mask. At each of the intersection points, or dots $p_i$, there is normally a cell pattern m that corresponds to the masking level concerned. In the example, this pattern m is represented in the form of a filled-in circle. In the central zone M-zc, there is a pattern on each dot. In the peripheral parts to the left M-zl and to the right M-zr, there are pattern-free dots such as $p_a$, $p_b$.

The design of these parts M-zl and M-zr is such that if they are superimposed, the patterns complement each other. If we take up FIG. 5 again, it will be understood that, in the overlap zones, outside the corners, the set of patterns m is provided by two exposures, an exposure of one peripheral part of the mask, and another exposure of the opposite peripheral part of the mask: these parts are complementary. At each corner, the patterns are provided by four exposures of the mask at each of the corners of the mask. Thus, the designs of the corners complement one another. Outside the corners, the right-hand and left-hand lateral peripheral parts and upper and lower peripheral parts respectively of the mask are complementary to each other taken in sets of two: the design of one is the negative of the other, apart from the corners.

Preferably, it is planned that each of these parts will have a pattern density substantially equal to ½, and to ¼ at the corners of the mask. Thus, at an overlap zone, the contribution of each exposure to the building of the full design is substantially equal.

Preferably, the function of random distribution of the pattern-free dots on the peripheral parts of the mask follows a law of increase or decrease according to the rows (lateral parts) and columns (upper and lower parts). Visually, this is expressed by a gradation in the distribution of the black dots: vertical gradation for the upper and lower parts, horizontal gradation for the lateral parts of the fuzzy zone and vertical and horizontal gradation at the corners. Starting from the outside of the mask and going towards the central region, there are thus ever fewer pattern-free dots. This is very visible in FIG. 6: at the edges of the central zone, the pattern-free dots are few in number. This is expressed visually by dark flecking. The closer we come to the outer edges of the mask, the greater the number of the pattern-free dots. This is visually expressed by light flecking. Preferably, it is planned that this function of random distribution of the pattern-free dots is a decreasing function (or increasing function) along the rows or columns. If, for example, a linear growth function is applied in the upper and lower peripheral parts on the first row adjoining the central zone, there will be, for example, one pattern missing. On the second row, two patterns will be missing, on the third row, three will be missing etc (vertical gradation). In the left and right lateral peripheral parts, it is a horizontal gradation as shown in FIG. 7. Other decreasing functions can be applied.

In the case of an active matrix with a colored filter structure, the function of random distribution of the pattern-free dots preferably takes account of the arrangement of the colored filters on the matrix. Indeed, depending on the associated colored filter, a pixel of a cell will have a different luminance. For example, it is known that the pixels associated with a green filter are far more luminous than those associated with a red or blue filter. If far too many patterns are removed from cells associated with the same color of filter, there is a risk of lowering the electro-optical performance of the display device. Let us take for example the right-hand lateral peripheral parts of the mask. Let it be assumed that the distribution function applied in this part chiefly results in not obtaining patterns of cells associated on the matrix with green filters. The patterns of these "green" cells are provided by another exposure of the mask, by the complementary left-hand lateral peripheral part. This procedure entails the strong risk that a luminance different to the rest of the screen will appear in this zone of the active matrix.

Thus, in the invention, it is preferably planned to distribute the pattern-free dots on the peripheral zone of the mask so that, in the patterns provided by an exposure of the mask, there is an equivalent number of patterns of cells lacking in each color. In this way, optimum aesthetic visual qualities are obtained.

Let us take an active matrix comprising a structure of "stripe" type colored filters. In a matrix having such a structure of filters, an pixel comprises three pixel components placed consecutively on the same row, with one pixel component associated with a red filter R, one pixel component associated with a green filter G and one pixel component associated with a blue filter B, this structure R, G, B being repeated all along the row and from one row to another. If the principle of the invention is applied to this case, in each row, whenever a pattern associated with one of the colors is removed, a pattern associated with each of the other colors is removed in the same line.

Preferably, again to improve the visual quality of the screens, it is planned not to remove the patterns by pixels. Indeed, in an overlap zone, the patterns would, in this case, be all provided by an exposure by group of three patterns, corresponding to the structure of the filters. This could visually result in an excessively rough structure. Thus, it is planned that the distribution of the patterns provided by an exposure in the overlap zone is such that, for each pixel in the peripheral zone, an exposure cannot provide only 0 or n=3 patterns, but can provide 0, 1, 2 or 3 patterns.

Figure 8A:
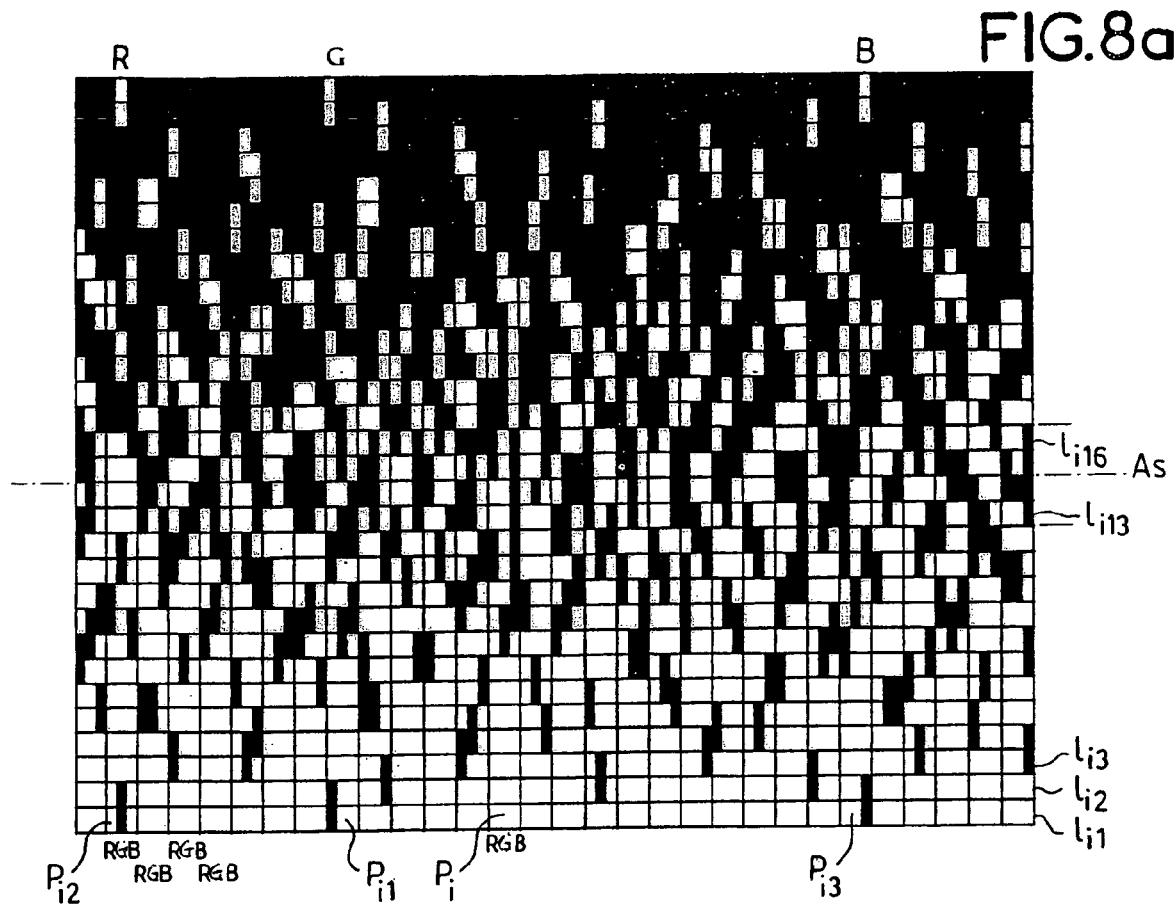
FIGS. 8a to 8d represent samples of upper, lower, right lateral and upper right corner parts respectively of the peripheral zone of an active zone mask according to the invention, intended for the manufacture of an active matrix comprising a structure of "stripe" type colored filters, FIGS. 9a and 9b provide a schematic view of a "quad" type structure of colored filters, FIGS. 10a to 10d provide a schematic view of reticles for active matrices associated with a given manufacturing level, on which the different masks needed to cover the active zone and the periphery are drawn according to a method in conformity with the invention.
Figure 8B:
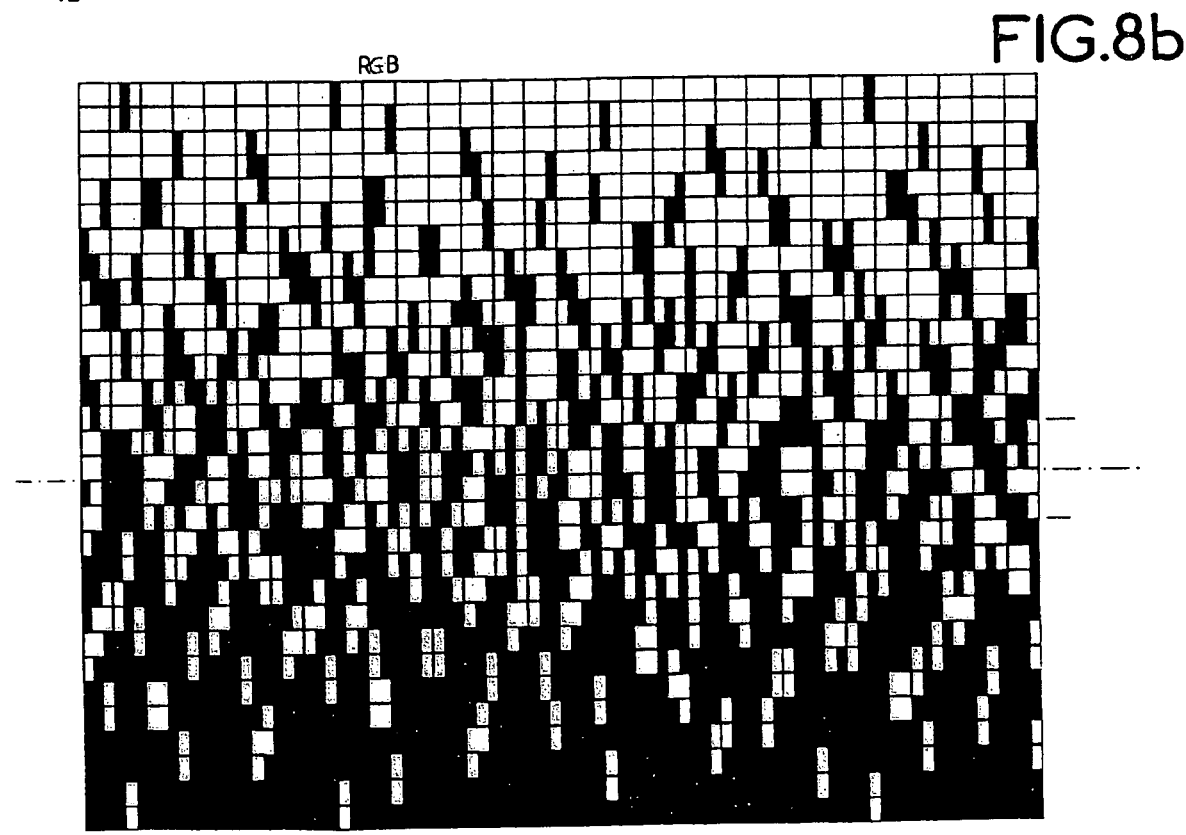
Figure 8D:
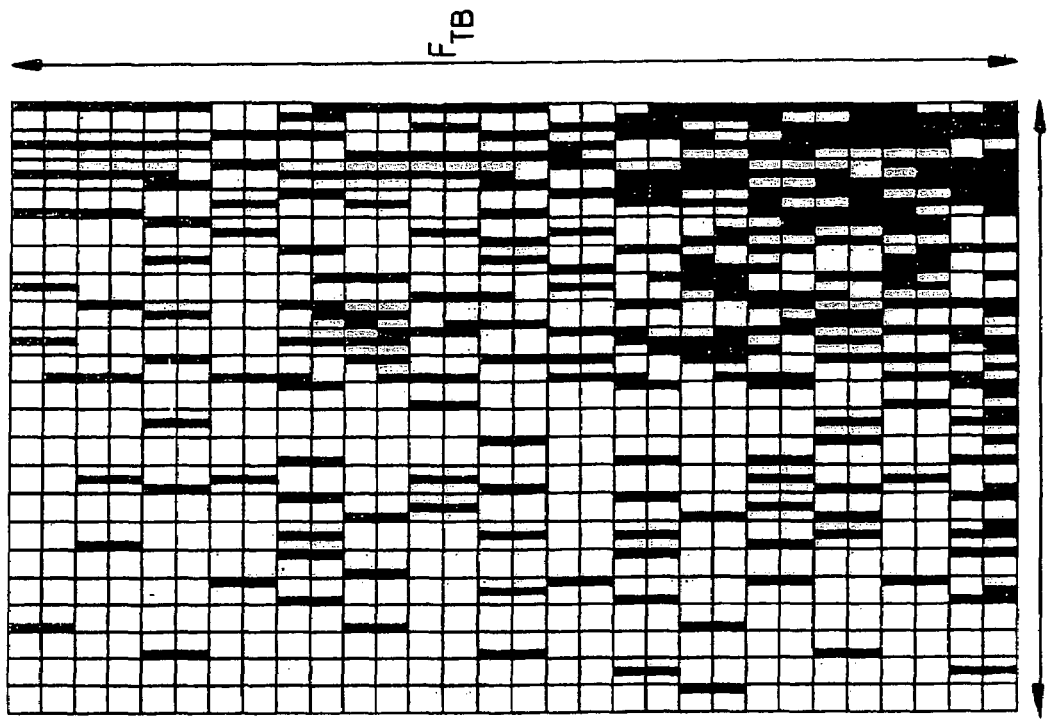
Figure 8C:
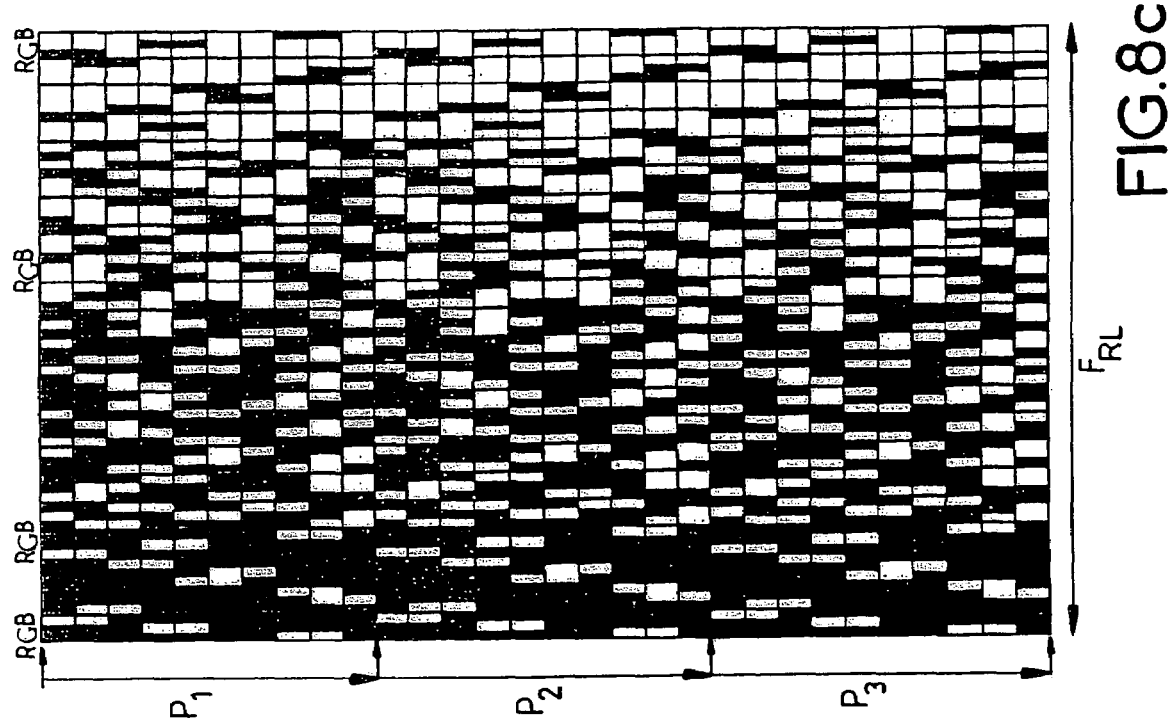

This is what can be seen in FIGS. 8a to 8d, which give a schematic view of the samples of design of the peripheral zone of a mask according to the invention. More specifically, FIG. 8a shows a sample of the upper part while FIG. 8b shows the complementary sample of the lower part, FIG. 8c shows a sample of the right-hand lateral part and FIG. 8d shows a right-hand upper corner. These samples take the form of a grid. Each row of squares corresponds to a row of cells on the matrix. Each column of squares corresponds to three columns of cells on the matrix, corresponding to the R, G, B structure of the filters. Each square of the grid thus corresponds to an pixel Pi comprising three successive cells on the same row: a red filter cell, a green filter cell G and a blue filter cell B.

The row $Ii_1$ at the bottom of the grid of FIG. 8a corresponds to the last row of the peripheral zone of the mask, before the central part (not shown). In this row $Ii_1$, a red filter cell pattern, a green filter cell pattern and a blue filter pattern are missing. Each of these missing patterns is taken from a group of dots of the mask corresponding to different pixels $Pi_1$, $Pi_2$ and $Pi_3$ of the matrix. In the next row $Ii_2$, two red filter R cell patterns, two green filter G cell patterns and two blue filter B cell patterns B are missing. And so on and so forth. Whether the cell is a red, green or blue filter cell depends on its position on the matrix, as a function of the structure of the colored filters of the matrix.

On the complementary sample shown in FIG. 8b, the row $Ii'_1$ has a design complementary to the design of the row $Ii_1$.

Figure 9A:
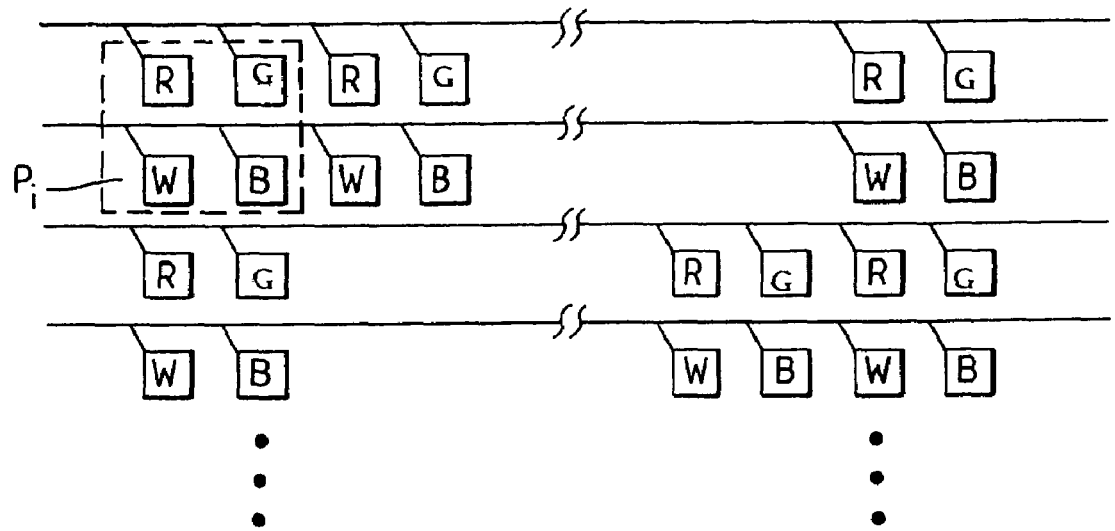
Figure 9B:
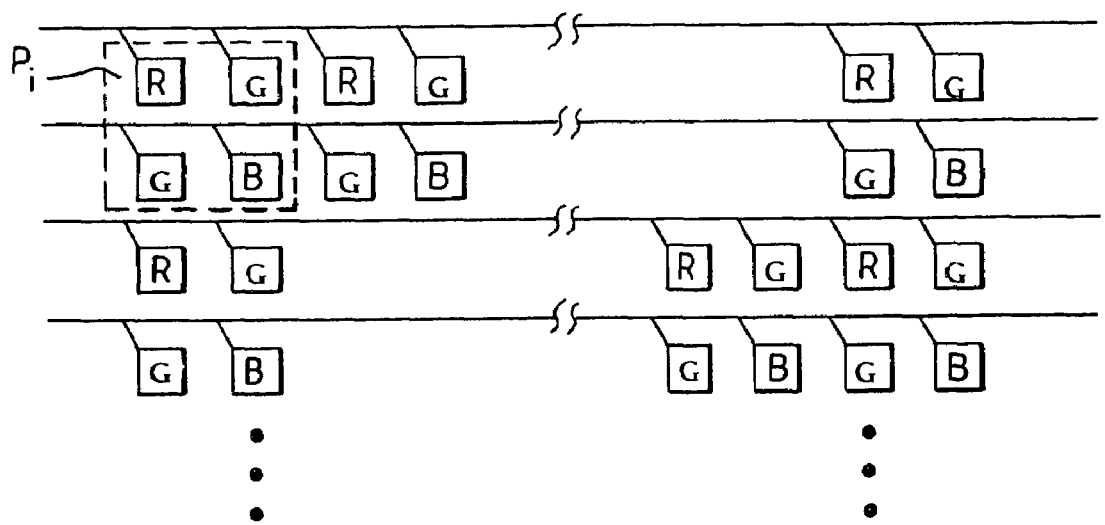

Another exemplary structure of a colored filter is shown in FIGS. 9a and 9b. These are "Quad" type structures. Each pixel comprises four pixel components positioned on two successive columns, two pixel components on a same row and two pixel components on the following row. In the matrix, on the even-parity rows, the pixel components are alternately colored red R and green G while, on the odd-parity row, the pixel components are alternately colored green G and blue B (FIG. 9b) or white W and blue B (FIG. 9a).

The same principles of distribution of the pattern-free dots explained here above are applied in preparing the design of the peripheral zone of the mask, in order to obtain the best optical quality.

If we take the quad structure of FIG. 9a, a mask according to the invention will have a peripheral zone design such that an exposure of this peripheral zone will provide an equivalent number of patterns per line in each of the colors per line. In other words, this exposure will give as much "red" as "green" in the even-parity rows and as much "green" as "blue" in the odd-parity rows (FIG. 9a).

Furthermore, in the same way as here above, in the design of the peripheral zone, the pattern-free dots are preferably distributed so that, for each pixel, an exposure of this peripheral zone cannot provide only 0 or n=2 patterns on the row but 0, or 1 or n=2 patterns. In other words, if the "even-parity" rows are taken for each pixel in the overlap zone, an exposure of the peripheral zone gives 0 patterns or one pattern (red or green) or both patterns (red and green).

There are other colored filter structures. In any case, to make a peripheral zone according to the invention, the function of distribution of pattern-free dots must take account of the structure of the filters along the rows of the matrix, in order to have fewer negative effects, especially with respect to differences in luminance brought by successive exposures.

A general definition of the rule of selection of pattern-free dots, for the design of the peripheral zone, can be stated as follows:

A structure of colored filters of a matrix comprises n colors per row: n=2 colors for the quad structure and n=3 colors in the RGB structure, for the two examples cited.

These rules can be expressed in the design of the peripheral zone as follows: in combining the dots by series of n successive dots along the rows, corresponding to a matrix with a periodic structure of n colored filters along the rows, and in assigning a rank 1, 2, ... n to each dot in each series, the distribution of the pattern-free dots in the peripheral zone (M-zp) of the mask is such that there is an equivalent number of pattern-free dots in each rank.

Advantageously, in the series of n dots, it is not possible to have only pattern-free dots or only dots with patterns: in each series, there may be 0, 1, 2 or n patterns missing.

In order to have the highest possible visual quality, the design of the peripheral zone of the mask must also preferably take account of the mode of addressing the rows of the matrix.

It is well known that the most common addressing modes, are the row, column or dot reversal addressing modes. If we take the row reversal addressing mode, in a frame, the polarity of the voltage applied is reversed at each row and reversed from frame to frame. In column reversal, the polarity is reversed at each column and reversed from frame to frame. In dot reversal, there is mixture of the two. These addressing modes prevent the clipping of the electrical field by preventing the migration of charges. These various addressing modes are used with active matrices having no colored filters. They are also used for active matrices with a stripe type filter structure. With quad type filter structures, another type of addressing is commonly used. This is the double-row reversal addressing mode: the first two rows are in one polarity, the second two rows are in the other polarity, and so on and so forth.

If the addressing mode is not given close consideration in the creation of the design of the peripheral zone, there is a risk of flicker. Let us take, for example, the dot reversal mode. In one frame, there is a reversal of polarity at each dot on each row, and a reversal from row to row. If these properties are not taken into account in the distribution of the pattern-free dots, then an overlap zone on the active matrix could very well have "positive" cell patterns which, to a major extent, would be brought about by the exposure of the peripheral part of a mask, and "negative" cell patterns which, to a major extent, would be brought about by exposure of the complementary peripheral part of the mask. The differences in luminance between the two exposures are then amplified, and may give rise to flicker.

The invention provides for grouping the pattern-free dots at least in pairs, corresponding to two cells having opposite polarities in the matrix, so as to provide each exposure with as many patterns of cells in one polarity as patterns of cells in the other polarity. The position of these dots is a function of the row and/or column addressing mode.

The position of these dots is also a function of the structure of colored filters in the case of a color matrix. Indeed, it is possible to obtain an additional advantage which is that of providing better compensation for the differences in luminance due to the different polarities in the frames, when the pattern-free dots grouped in pairs correspond to cells that have opposite polarity but are associated with the same color (and therefore have the same luminance).

If we consider an active matrix with any colored filter structure whatsoever and take any cell whatsoever of the structure: there is at least one cell that is a close neighboring cell having the opposite polarity associated with the same color, according to the horizontal and/or vertical periodicity of the filter structure and according to the frame reversal mode. A rule for grouping the pattern-free dots in sets of two can easily be deduced therefrom for each type of active matrix.

In the case of an RGB structure matrix, for example, having a column reversal addressing mode, an immediately neighboring cell having opposite polarity and the same color as, for example, a red cell is located on the same row as this cell: it is the following or preceding red cell in the row, as illustrated in the following table:

|   | G - | B + |   | G + |
|---|-----|-----|---|-----|
| R + | G - | B + | R - | G + |

In the case of an RGB structure matrix, for example, for a row reversal or dot reversal addressing mode, an immediately neighboring cell having opposite polarity and the same color as, for example, a green cell is located on the same column as this cell: it is the green cell on the preceding row or the following row as illustrated in the following table:

| R + | G - | B + | R - | G + |
|-----|-----|-----|-----|-----|
| R - | G + | B - | R + | G - |

In the case of a quad structure matrix, for which it has been seen that the addressing mode is the double-row reversal mode, an immediately neighboring cell having opposite polarity and the same color as a cell, for example a red cell, is located on the same column as this cell and on the following row of the same parity: it is a red cell on the same column and following or preceding even-parity row as illustrated in the following table:

| Even-parity row | R | G + | R + | G + | R + |
|---|---|---|---|---|---|
| Odd-parity row | G + | B + | G | B + | G + |
| Even-parity row | R | G - | R - | G - | R - |
| Odd-parity row | G - | B - | G | B - | G - |

In the second example, which corresponds to an RGB structure (stripe) active matrix in row or dot reversal mode, this amounts simply, on the design of the mask, to grouping the pattern-free dots at least two by two, vertically, according to the columns. In this way, the problems related to the addressing modes are reduced in a simple and efficient way, especially in row or dot reversal: the associated rule of design takes the form of a selection on the basis of vertical pairs: the selection of a dot in a row leads to the selection, in the following row, of the dot on the same column. In the samples of FIGS. 8a, 8b, this is expressed by black rectangles (pattern-free dots) on at least two squares vertically. By complementarity, we also have blank rectangles (dots with patterns) on at least two squares vertically.

The same design is applicable in the case of a matrix without colored filters, in row or dot reversal mode.

In the case of a matrix without colored filters, in column reversal mode, the pattern-free dots are selected by horizontal pairs of successive dots.

In the other cases, the rule of design corresponding to the selection rule depends on the periodicity intrinsic to the structure of the filters on the matrix and to the matrix addressing mode.

Thus, the preparation of the design in the peripheral zone of the mask depends on the different layout and design rules for the masks and the different rules of distribution of the previous pattern-free dots, for which it has been verified that they give optimum visual qualities. In particular, this preparation depends on the horizontal and vertical shading or gradation functions to be applied, on the mode of addressing the matrix and, possibly, on the structure of the colored filters. The widths of the lateral and upper/lower parts may be different, the constraints being generally different on these parts.

In practice, the preparation of the design in the peripheral zone of the mask, all around the central zone, may be simplified by simple rules of layout and design.

If we take FIG. 8a for example, in this sample, there is a reverse mirror effect in the design relative to the axis A1 which cuts the sample into two longitudinally. However, a few lines around this axis, the lines $Ii_{13}$ to $Ii_{16}$ in the example, are not affected by this reverse mirror effect.

It is also possible to repeat a random design. This can be seen in the sample of a left-hand lateral peripheral part in FIG. 8c: the same random design is repeated three times (p1, p2, p3) vertically.

Finally, the distribution of the pattern-free dots (or dots with patterns, by complementarity) is a function of the density of patterns sought for each exposure. Preferably, to have a better fuzzy effect in terms of luminance, it is sought to have a situation where each exposure of the peripheral part in an overlap zone on the matrix provides substantially the same density of patterns. In practice, it is planned that the densities should be substantially equal: there is then a density of patterns in the peripheral parts substantially equal to ½ except at the corners, where it is substantially equal to ¼.

Thus, as shown in FIG. 10b, an active zone mask $Mza_{FUZZY}$ according to a preferred embodiment of the invention, can be subdivided into zones with different densities of patterns. These are the central zone 10 with a density 1 of the patterns, the upper zone 11, lower zone 12, left lateral zone 13, right lateral zone 14 with a density of ½, and the four corners 15, 16, 17 and 18, with a density of ¼. For the zones with a density of ½, two exposures are needed to have the full design. For the zones with a density of ¼, four exposures are needed.

Figure 11:
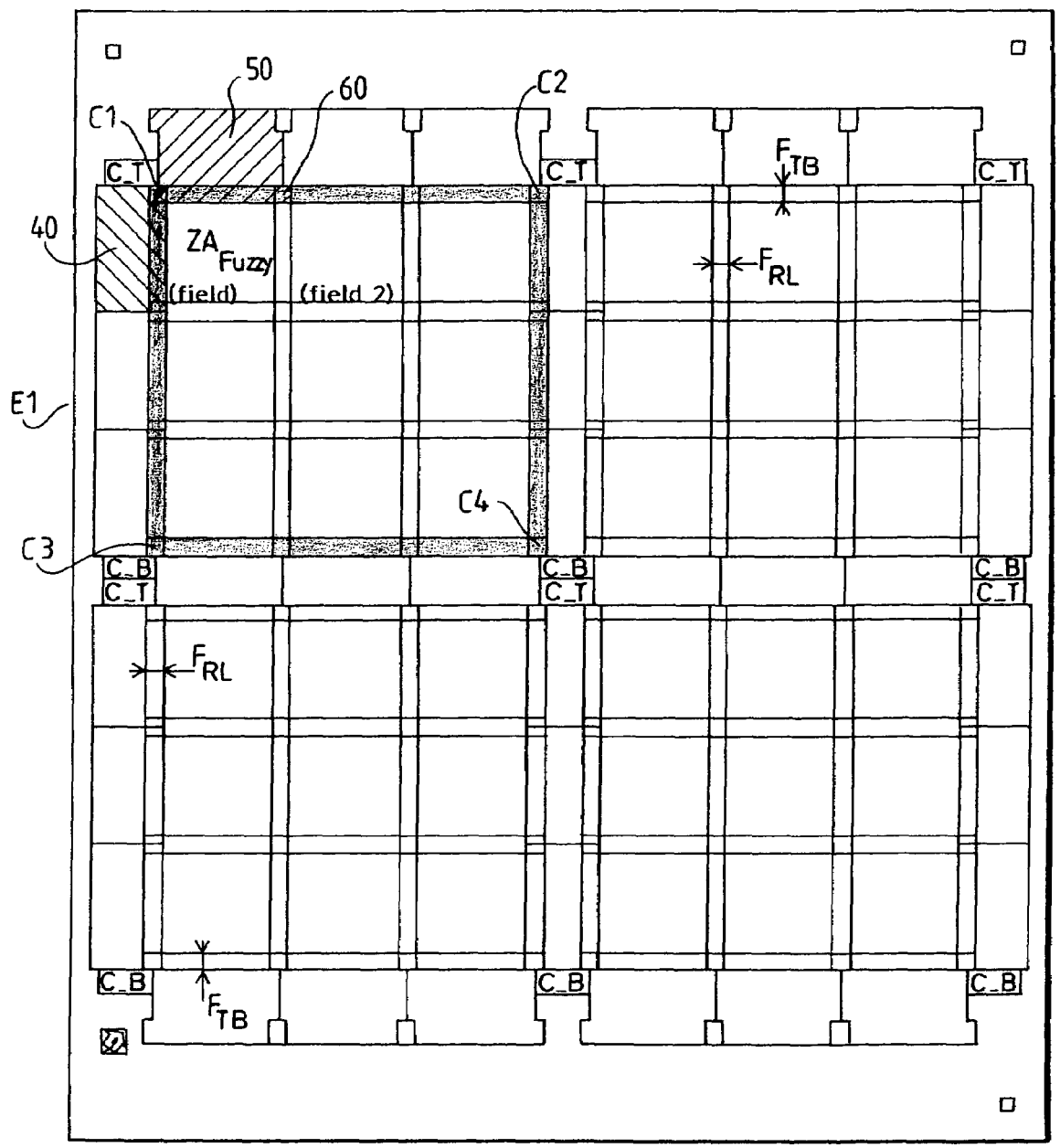
FIG. 11 shows the corresponding exposed fields on the active matrix.

If this mask is transferred according to the method of the invention, the active zone of the matrix is covered, for example in nine exposures per matrix, as shown in FIG. 11. After these nine exposures, the patterns are however not all fully done on the edges, on a width corresponding to the width of the fuzzy zones of the mask: $F_{RL}$ on the right-hand and left-hand edges of the active zone, $F_{TB}$ on the upper and lower edges of the active zone.

There are thus several ways of completing these edges, by using peripheral masks and/or specific masks. Indeed, the defect known as the "stepper pattern" defect is hardly visible at the edge of screens. It is therefore possible to use other masks to complete the edges rather than the active zone mask. For a given type of matrix, the choice of a solution will be chiefly motivated by a compromise between the space available at the periphery, the periodicity of the fuzzy design in comparison with that of the peripheral designs, and the number of exposures (shots) per level, which it is generally sought to minimize, in order to optimize the manufacturing time.

A first exemplary embodiment is shown in FIGS. 10a to 10d in combination with FIG. 11. FIGS. 10a to 10d show reticles on which masks are made enabling the implementation of a method of overlapping according to the invention. FIG. 11 shows the exposed fields with these masks on the matrix.

In FIG. 11, the exposed fields in the active zone are obtained by successive transfers, with overlapping, of the active zone mask $Mza_{FUZZY}$ shown in FIG. 10b. If we take the active matrix referenced E1, the shaded-shaded zone shows the edges of the active zone which are exposed only once through the mask $Mza_{FUZZY}$. In this shaded-shaded zone, therefore, there is a density of patterns equal to ½, except at the four corners c1, c2, c3 and c4 of the matrix where the density of the patterns is only ¼.

These patterns are completed here by means of the peripheral masks. These masks are described in detail with reference to FIGS. 10a and 10c.

The peripheral left/right lateral mask referenced $Mtb_{FUZZY}$ positioned vertically in FIG. 10a, has a central part 30 that corresponds to the usual design of the peripheral circuits, and two zones 31 and 32 on either side that correspond to the fuzzy design to be completed to the right and to the left of the matrix. These two vertical zones have the same width, i.e. $F_{RL}$, as the zones that they have to complete, and a pattern density of ½.

The upper/lower peripheral mask referenced $Mtb_{FUZZY}$ positioned horizontally in FIG. 10c, has a central part 20 that corresponds to the usual design of the peripheral circuits, and two horizontal zones on either side that correspond to the fuzzy design to be completed to the right and to the left of the matrix. These two horizontal zones have the same width, i.e. $F_{TB}$, as the zones that they have to complete, and a pattern density of ½, except at each end, at b1, b2, b3 and b4 in the figure, where this density is equal to ¼. Furthermore, these zones overflow on each side to form an ear with a density of ¼. These ears are referenced o1, o2, o3, o4 in the figure. At each end, there is thus a density of ¼ on the length $F_{RL}$. This peripheral mask is transferred along the upper and lower peripheral edges of the matrix so that there is an overlapping of the ends with a density of ¼. The zones 21 and 22 respectively of this mask complete the zone 12 and 11 respectively of the active zone mask. The zone (o2+b2) is completed by the zone (b4+o4), the two zones providing ½ each; the zone (o1+b1) is completed by the zone (b3+o3), the two zones providing ½ each.

The peripheral corner mask Mc is unchanged with respect to the prior art methods.

The example shown in FIG. 11 corresponds to an implementation of the invention in which the right/left fuzzy zone on the edges of the active zone straddle the active zone and the peripheral zone.

Referring to FIG. 11, the contribution of the peripheral lateral mask $MRL_{FUZZY}$ is indicated in hatched portions in the zone 40. It completes the shaded-shaded region by providing a density of ½ of the motifs. At the corner c1, there are still ¼ of the patterns lacking. It is the role of the ears in the peripheral upper/lower mask to provide these patterns that are lacking. The contribution of this mask is indicated by hatched portions in the zone 50. In the example, the corner c1 is thus made with a contribution of ¼ given by the zone 18 of the mask $MZA_{FUZZY}$, a contribution of ½ given by the zone 32 of the mask $MRL_{FUZZY}$ and a contribution of ¼ given by the zone o2+b2 of the mask $MTB_{FUZZY}$.

The zone 60 in FIG. 11 corresponds to a right-hand corner of an active zone field 1 and a left-hand corner of an active zone field 2 made beside it. The density of the patterns provided in this zone by the mask $MZA_{FUZZY}$ exposed twice (fields 1 and 2, FIG. 11) is equal to ½. Of the complement of the patterns, ¼ is then provided by b4+o4 in a first exposure of the mask $MTB_{FUZZY}$ (fields 1) and ¼ is provided by o2+b2 in a second exposure of the mask $MTB_{FUZZY}$ (field 2).

An alternative embodiment is shown in FIG. 10d. In this alternative embodiment, the upper/lower peripheral mask no longer has any ears. It gets positioned edge to edge, along the upper and lower peripheral edges, and completes the shaded-shaded zone of the active zone along these edges at ½. The corners c1, c2, c3, c4 and the zones such as 60, at the edge in the active zone, corresponding to the corners in the overlap zone of the fields, are also completed at ¼ by a specific supplementary mask, referenced $C_{FUZZY}$, with a length equal to once $F_{RL}$. In this variant, the number of exposures to be made per level is increased.

Other variants are possible. In particular, if there is place available, the peripheral circuit elements can be moved slightly away from the matrix so that, instead of being positioned on the edge of the active zone, the active zone masks will be made to straddle this boundary so that the fuzzy zone of the mask is exposed in the peripheral part. A second exposure, with an adapted peripheral zone mask, enables these patterns to be cancelled.

One of the problems related to the use of the peripheral masks is that these masks should properly match the random design to be completed. In other words, the random design that a peripheral mask must complete should always be the same. If the random design is periodic, the length of the peripheral mask should be compatible with this periodicity. In the example of FIG. 11, the constraint of periodicity applies along the columns, that is vertically. In other examples, there could also be a constraint of periodicity along the rows.

When the fuzzy design overflows on the peripheral part, it is also necessary to have enough place at the periphery.

When it is not possible to envisage the use of peripheral masks, or only a part of these masks, for example when only the upper/lower peripheral mask is used, then specific masks are used to complete the edges. Such a variant is shown in FIGS. 12a to 12c and 13.

Figure 12A:
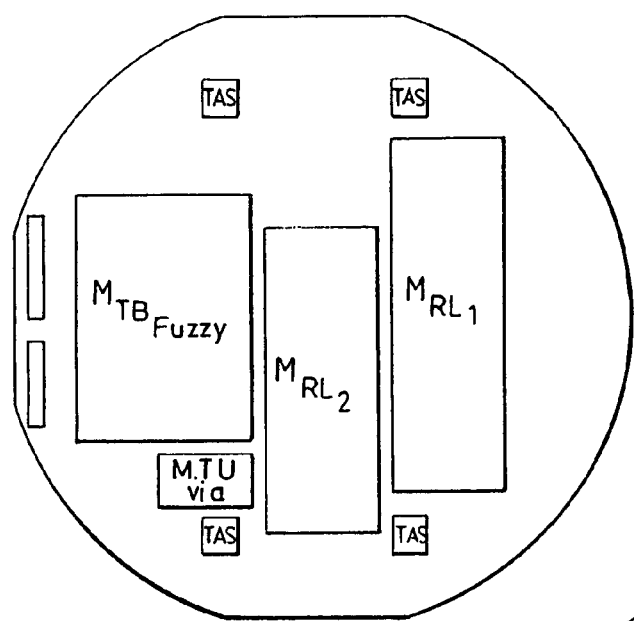
FIGS. 12a to 12c show another exemplary set of reticles by which the invention can be implemented.

In FIG. 12a, there is a first reticle that comprises an upper/lower peripheral mask, of a fuzzy type, as in the above case, referenced $MTB_{FUZZY}$, and two lateral peripheral masks $MRL_1$ and $MRL_2$. These two masks $MRL_1$ and $MRL_2$ correspond to a different design, typically at the flared portion toward the periphery, of the rows of the matrix.

Figure 12B:
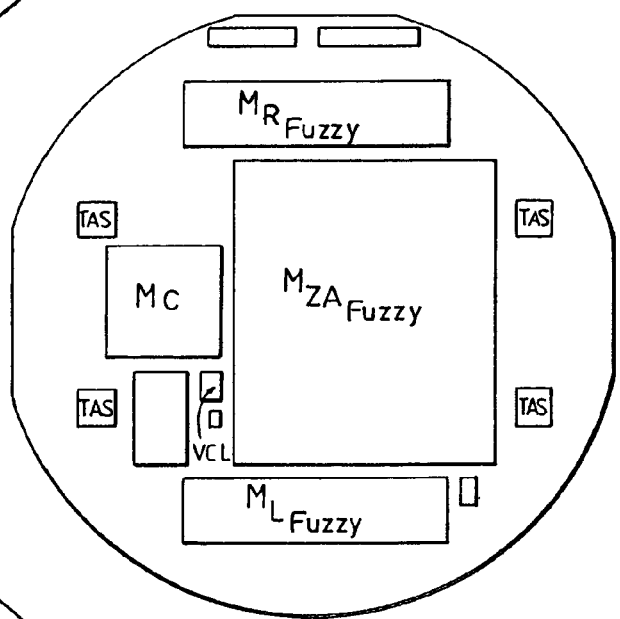
Figure 12C:
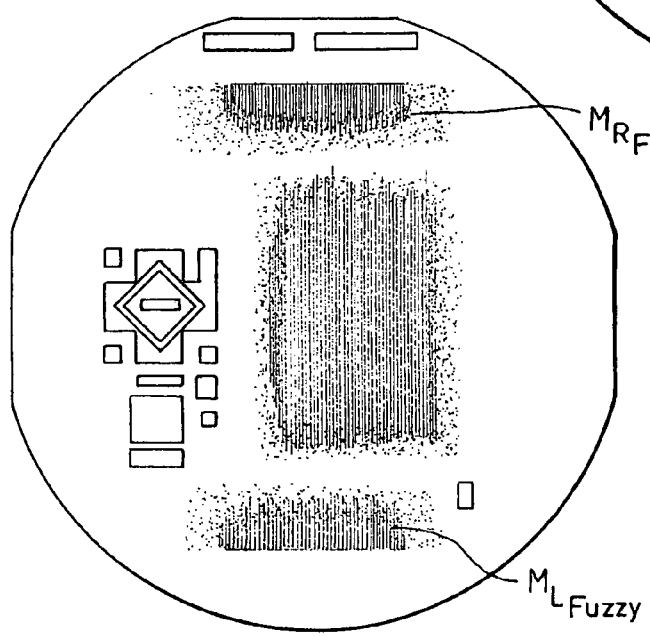
Figure 13:
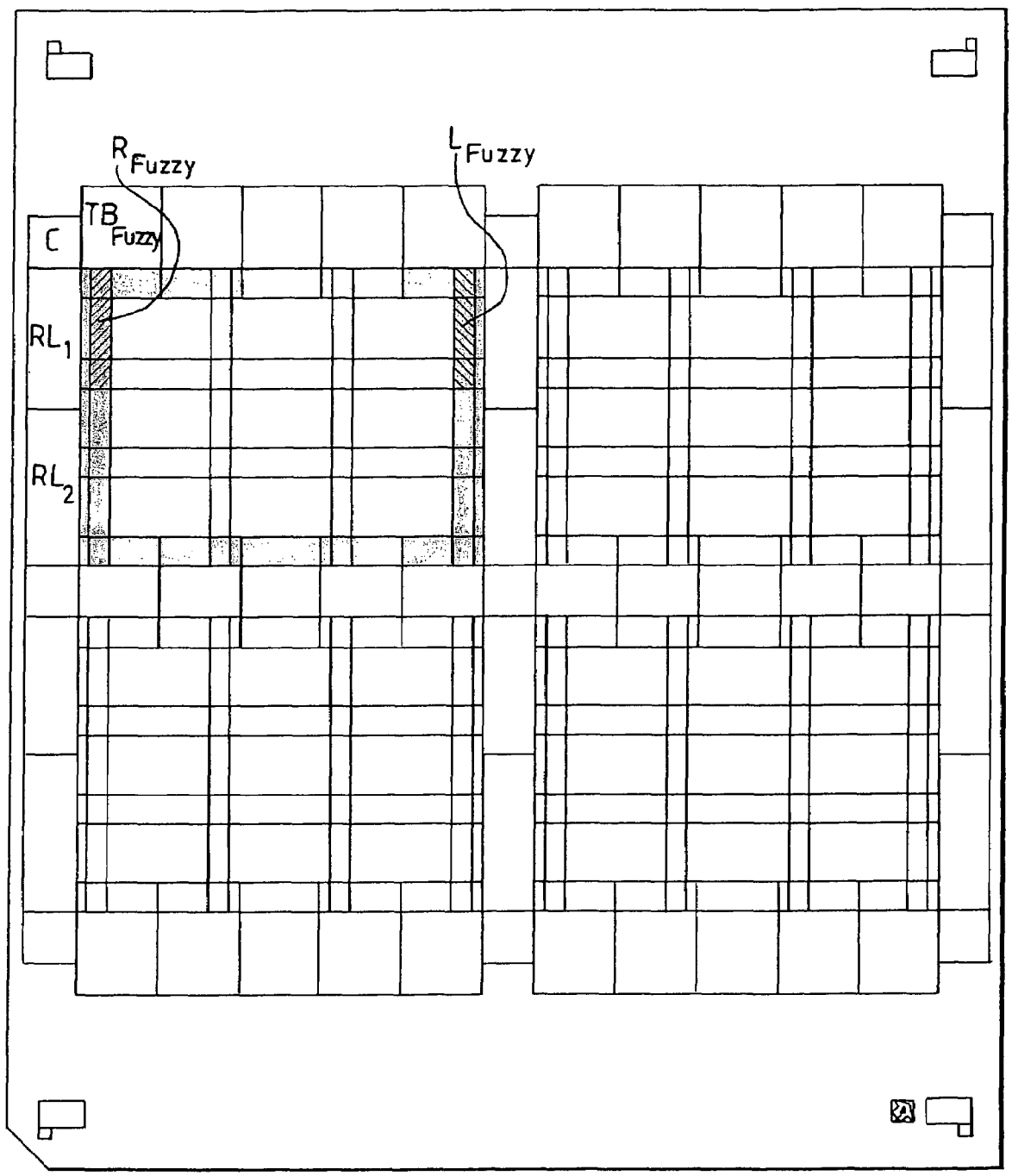
FIG. 13 shows the corresponding insulated fields on the active matrix.

FIG. 12b shows a second reticle comprising two fuzzy lateral masks, a left-hand mask $MI_{FUZZY}$, and a right-hand mask $MI_{FUZZY}$, and the active zone mask according to the invention, $MZA_{FUZZY}$. The difference with the above embodiment is that the left-hand and right-hand fuzzy lateral masks are respectively exposed on the edges of the active zone, shown in hatched portions in FIG. 13, respectively on the right-hand lateral edge, and left-hand lateral edge of the fuzzy zone (shaded gray) given by the active zone mask.

The image of the second reticle is shown in FIG. 12.

The invention that has just been explained and illustrated with reference to exemplary practical embodiments can generally be applied to the manufacture of active matrices for display devices. It improves their electro-optical qualities. In particular, the aesthetic visual quality of the highly-density screens is substantially improved.

The method can be applied to any other method of manufacture by photo-etching of patterns that have to be repeated, in a single operation, on a surface bigger than the exposed zone and are required to have identical properties, for example, for matrices of sensors and detectors such as X-ray detectors.

What is claimed is:

1. A method of manufacture of an active matrix including an active zone including a set of cells arranged in an array of rows and columns, said method comprising:

depositing a layer of a material and making a pattern on the layer by a mask transferred plural times to the active zone, to make successive exposure fields covering a totality of the active zone, wherein a same mask is used for the whole active zone except for an outer periphery of the active zone;

wherein an overlapping method is applied providing a non-null overlap zone between two successive exposure fields, each exposure giving a part of the patterns to the overlap zone, wherein in two successive exposures, for the overlap zone, apart from end zones of the overlap zone, corresponding to corner zones of the mask, the pattern on the layer is completed, a matrix being organized according to a structure of pixels $P_i$, corresponding to a structure of colored filters of the matrix, each pixel comprising a group of cells positioned on successive rows and/or columns and each cell being associated with a filter color, wherein a distribution of the patterns provided by a given exposure step in an overlap zone is a function of said structure of filters on the matrix, and each cell of the matrix being associated with a filter color, according to a structure such that each row of the matrix comprises an equivalent number of cells per filter color, wherein the distribution of the patterns given by an exposure step in an overlap zone is such that, on each row of the overlap zone, there is an equivalent number of patterns provided in each color filter.

2. A method of manufacture according to claim 1, wherein, in a field overlap zone, the patterns to be made are provided by at least two exposures of the active zone mask, the patterns of the overlap zone being distributed between the different exposures randomly or pseudo-randomly.

3. A method of manufacture according to claim 2, wherein each of the different exposures of the active zone mask provides substantially a same density of patterns in the overlap zone.

4. A method of manufacture according to claim 3, wherein an exposure field corresponding to an exposure of the active zone mask comprises a central zone in which a density of the patterns given by exposure is equal to 1, and peripheral overlap zones of the central zones in which the density of the patterns given by an exposure is smaller than 1, said overlap zones corresponding to left lateral, right lateral, upper and lower parts respectively, said overlap zones, taken in sets of two, having a corner of a field in common.

5. A method of manufacture according to claim 4, wherein the density of the patterns provided by an exposure in the overlap zones is substantially equal to ½ except at corners in which it is substantially equal to ¼.

6. A method of manufacture according to claim 1, wherein, in a field overlap zone, the patterns provided by an exposure are distributed according to a gradation on a width of the overlap zone, the pattern being ever smaller in number at a field boundary.

7. A method of manufacture according to claim 6, wherein the gradation follows a linear law throughout the width of the overlap zone.

8. A method of manufacture according to claim 1, the matrix being organized according to a structure of pixels $P_i$, corresponding to a structure of colored filters of the matrix, each pixel comprising a group of n cells positioned on successive rows and/or columns and each cell being associated with a filter color, wherein the distribution of the patterns provided by an exposure step in an overlap zone is such that, at each pixel of this zone, there cannot be only 0 or n patterns.

9. A method of manufacture of an active matrix including an active zone including a set of cells arranged in an array of rows and columns, said method comprising:
  depositing a layer of a material and making a pattern on the layer by a mask transferred plural times to the active zone, to make successive exposure fields covering a totality of the active zone,
  wherein a same mask is used for the whole active zone except for an outer periphery of the active zone;
  wherein an overlapping method is applied providing a non-null overlap zone between two successive exposure fields, each exposure giving a part of the patterns to the overlap zone,
  wherein in two successive exposures, for the overlap zone, apart from end zones of the overlap zone, corresponding to corner zones of the mask, the pattern on the layer is completed, and
  wherein the distribution of the patterns conveyed by an exposure in an overlap zone depends on a mode of addressing the rows and/or columns of the matrix.

10. A method of manufacture of an active matrix including an active zone including a set of cells arranged in an array of rows and columns, said method comprising:
  at least one step for depositing a layer of a material and making a pattern on the layer by a mask transferred plural times to the active zone, to make successive exposure fields covering a totality of the active zone,
  wherein an overlapping method is applied providing a non-null overlap zone between two successive exposure fields, each exposure giving a part of the patterns to the overlap zone, and
  wherein a distribution of the patterns conveyed by an exposure in an overlap zone depends on a mode of addressing the rows and/or columns of the matrix.

11. A method of manufacture according to claim 10, wherein, for row and/or column reversal type addressing modes, the distribution of the patterns given by an exposure in an overlap zone is such that the patterns of cells are missing at least for two cells of opposite polarity that are most immediately neighboring cells.

12. A method of manufacture according to claim 11, each cell of the matrix being associated with a filter color, according to a structure such that each row of the matrix comprises an equivalent number of cells per filter color, wherein the distribution of the patterns provided by an exposure in an overlap zone is such that the patterns of cells are missing at least for two cells, of opposite polarity and of a same color that are the most immediately neighboring cells.

13. A method of manufacture according to claim 10, applied to each of the steps for the deposition of a layer of material and the making of a cell pattern on the layer by photo-exposure of a corresponding active zone mask.

14. A method of manufacture according to claim 10, for a transistor-based active matrix, each cell of the matrix comprising a pixel with a pixel electrode and a transistor connected to an array of rows and columns, each transistor comprising a gate, a first and a second electrode, a semiconductor channel between the gate and the first and second electrodes, the first electrode being connected to a column of the matrix, the second electrode being connected to a pixel electrode and the gate being connected to a row of the matrix, wherein the overlapping method is applied at least to each of the layers on which the columns, the semiconductor channels, and the pixel electrodes are formed.

15. A method according to claim 14, wherein, for the layers of the matrix to which the overlapping method is applied, the overlap zones are at same positions on the active zone, with a same distribution of the patterns between the different steps of exposure of the overlap zones from one layer to another.

16. An active matrix display or electro-optical detection device, wherein the active matrix is obtained by a method of manufacture according to claim 10.

* * * * *